United States Patent
Lai et al.

(10) Patent No.: US 10,003,153 B1
(45) Date of Patent: Jun. 19, 2018

(54) CONNECTOR MODULE

(71) Applicant: GIGA-BYTE TECHNOLOGY CO., LTD., New Taipei (TW)

(72) Inventors: Chih-Ming Lai, New Taipei (TW);
Yung-Shun Kao, New Taipei (TW);
Chung-Wei Chiang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days. days.

(21) Appl. No.: 15/616,938

(22) Filed: Jun. 8, 2017

(30) Foreign Application Priority Data

Apr. 11, 2017 (TW) .............................. 106111970 A (51) Int. Cl.
*H01R 13/516* (2006.01)
*H01R 12/73* (2011.01)
*H05K 9/00* (2006.01)
*H05K 1/02* (2006.01)

(52) U.S. Cl.
CPC ........... *H01R 13/516* (2013.01); *H01R 12/73* (2013.01); *H05K 1/0203* (2013.01); *H05K 9/0024* (2013.01)

(58) Field of Classification Search
CPC ...... H01R 12/73; H01R 12/88; H01R 13/516; H05K 1/0203; H01L 23/34; H01L 2023/4037; H01L 2023/4062; H01L 2023/4075
See application file for complete search history.

(56) References Cited

U.S. PATENT DOCUMENTS

| 3,946,276 | A  | * | 3/1976 | Braun | H01L 23/4006 174/15.1 |
| 4,692,790 | A  | * | 9/1987 | Oyamada | H05K 7/1061 257/727 |
| 6,278,610 | B1 | * | 8/2001 | Yasufuku | H05K 7/1431 165/185 |
| 6,570,763 | B1 | * | 5/2003 | McHugh | H01L 23/4093 165/185 |
| 7,106,591 | B2 | * | 9/2006 | Fan | H01L 23/4093 165/80.3 |
| 7,559,784 | B2 | * | 7/2009 | Hsiao | H05K 7/1053 439/331 |
| 7,803,006 | B2 | * | 9/2010 | Lin | G01R 1/0466 439/331 |
| 7,946,881 | B2 | * | 5/2011 | Hsieh | H05K 7/1053 439/331 |

(Continued)

FOREIGN PATENT DOCUMENTS

| CN | 201440559 | 4/2010 |
| TW | M302145 | 12/2006 |

OTHER PUBLICATIONS

"Office Action of Taiwan Counterpart Application," dated Sep. 18, 2017, p. 1-p. 6.

*Primary Examiner* — James Harvey
*Assistant Examiner* — Oscar Jimenez
(74) *Attorney, Agent, or Firm* — JCIPRNET (57) ABSTRACT

A connector module including a connector and a heatsink is provided. The connector includes a shaft. The heatsink includes a groove recessed in a single direction. The heatsink is adapted to move along a direction opposite to the recessed direction of the groove to insert the shaft into the groove. The shaft is pivoted in the groove so that the heatsink is adapted to pivotally rotate relative to the connector.

8 Claims, 11 Drawing Sheets

(56) References Cited

U.S. PATENT DOCUMENTS

| | | | | |
|---|---|---|---|---|
| 8,052,439 B2* | 11/2011 | Fan | .................. | H05K 7/1061 |
| | | | | 439/135 |
| 8,579,645 B2* | 11/2013 | Wang | .................. | H01R 12/83 |
| | | | | 439/326 |
| 2002/0075024 A1* | 6/2002 | Fredeman | ............ | G01R 1/0458 |
| | | | | 324/750.05 |
| 2004/0120119 A1* | 6/2004 | Lee | .................. | H01L 23/4093 |
| | | | | 361/709 |
| 2005/0094366 A1* | 5/2005 | Lewis | .................. | G06F 1/184 |
| | | | | 361/679.33 |
| 2009/0104807 A1* | 4/2009 | Lin | .................. | G01R 1/0466 |
| | | | | 439/341 |
| 2012/0100730 A1* | 4/2012 | Yokoyama | ............ | G01R 1/0466 |
| | | | | 439/68 |
| 2012/0142209 A1* | 6/2012 | Yeh | .................. | H01R 12/88 |
| | | | | 439/345 |
| 2012/0156919 A1* | 6/2012 | Yeh | .................. | H01R 12/88 |
| | | | | 439/370 |
| 2014/0307400 A1* | 10/2014 | French, Jr. | ........... | H05K 7/1427 |
| | | | | 361/755 |
| 2016/0156117 A1* | 6/2016 | Wang | .................. | H01R 12/714 |
| | | | | 439/65 |

* cited by examiner

CONNECTOR MODULE

CROSS-REFERENCE TO RELATED APPLICATION

This application claims the priority benefit of Taiwan application serial no. 106111970, filed on Apr. 11, 2017. The entirety of the above-mentioned patent application is hereby incorporated by reference herein and made a part of this specification.

BACKGROUND OF THE INVENTION

1. Field of the Invention

The invention relates to a connector module, and particularly relates to a connector module having a heatsink.

2. Description of Related Art

To facilitate the speed and efficiency of data transmission of computers, the data storage medium of computers has been shifted from hard disk drives (HDD) to solid state drives (SSD). In the era of big data, in order to further facilitate the performance of SSDs, the standards of internal extension cards and relevant connectors of the computers have been shifted from the standard of mini serial advanced technology attachment (mSATA) to the standard of next generation form factor (NGFF). Currently, the more common NGFF standard is the M.2 standard.

Since relevant products adopting the M.2 standard may generate a significant amount of heat during high-speed transmission, and the performance of the products is thus reduced, a heatsink is required to lower the working temperature of the relevant products adopting the M.2 standard. However, due to a limited installation space and the difficulty in alignment, it is not convenient to install the conventional heatsink. In addition, the conventional heatsink may suffer from structural damages when being installed/uninstalled.

SUMMARY OF THE INVENTION

The invention provides a connector module that is easy to align and install, and does not easily suffer from structural damage during installation/uninstallation.

A connector module according to an embodiment of the invention includes a connector and a heatsink. The connector includes a shaft. The heatsink includes a groove recessed in a single direction. The heatsink is adapted to move along a direction opposite to the recessed direction of the groove to insert the shaft into the groove. The shaft is pivoted in the groove so that the heatsink is adapted to pivotally rotate relative to the connector.

According to an embodiment of the invention, the connector includes a connector body and a cover, the cover covers the connector body, and the shaft is located on the cover.

According to an embodiment of the invention, the groove is a U-shaped groove.

According to an embodiment of the invention, a width at an opening of the groove is greater than a width at an inside of the groove.

According to an embodiment of the invention, the heatsink includes holding parts located at opposite sides of the heatsink.

According to an embodiment of the invention, the heatsink includes a base and a fin set disposed on the base, and the holding parts extend from the base in a direction away from the fin set.

According to an embodiment of the invention, the heatsink includes a base, a fin set disposed on the base, and a pivot part extending from the base, the groove is located on the pivot part, and the recessed direction of the groove on the pivot part is parallel to an extending direction of the base.

According to an embodiment of the invention, the heatsink includes a base, a fin set disposed on the base, and a pivot part extending from the base, the groove is located on the pivot part, and the recessed direction of the groove on the pivot part is perpendicular to an extending direction of the base.

According to an embodiment of the invention, the heatsink includes a base and a fin set disposed on the base, and the base includes a fixing part configured to fix a circuit board.

According to an embodiment of the present invention, the shaft includes a blocking part located at an end, and a width of the blocking part is greater than a width of the groove.

Based on the above, in the connector module according to the embodiments of the disclosure, it is easy to align and install the groove of the heatsink and the shaft of the connector, and the heatsink does not easily suffer from structural damage during installation/uninstallation.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
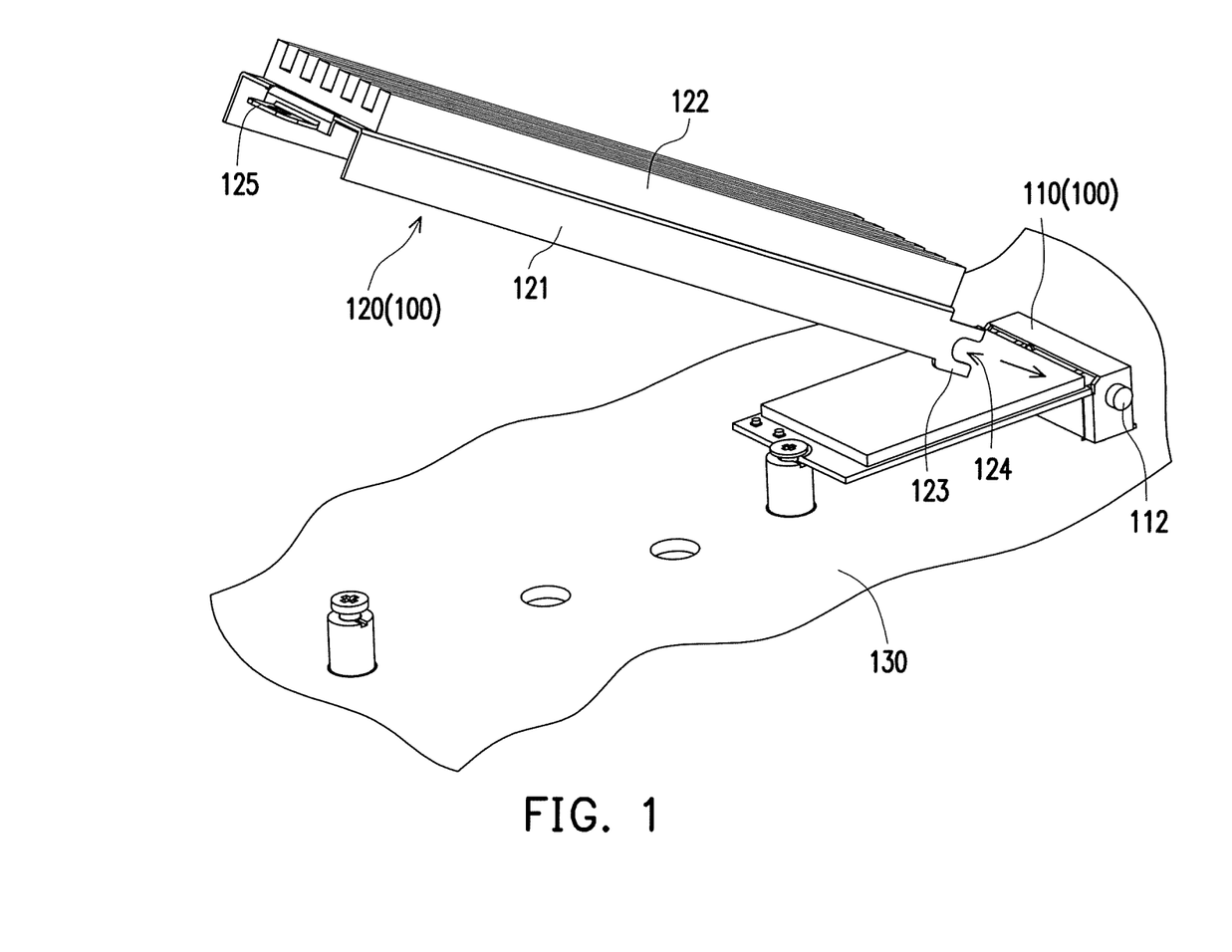
FIGS. 1 to 3 are schematic views illustrating assembling of a connector module according to an embodiment of the invention.
Figure 2:
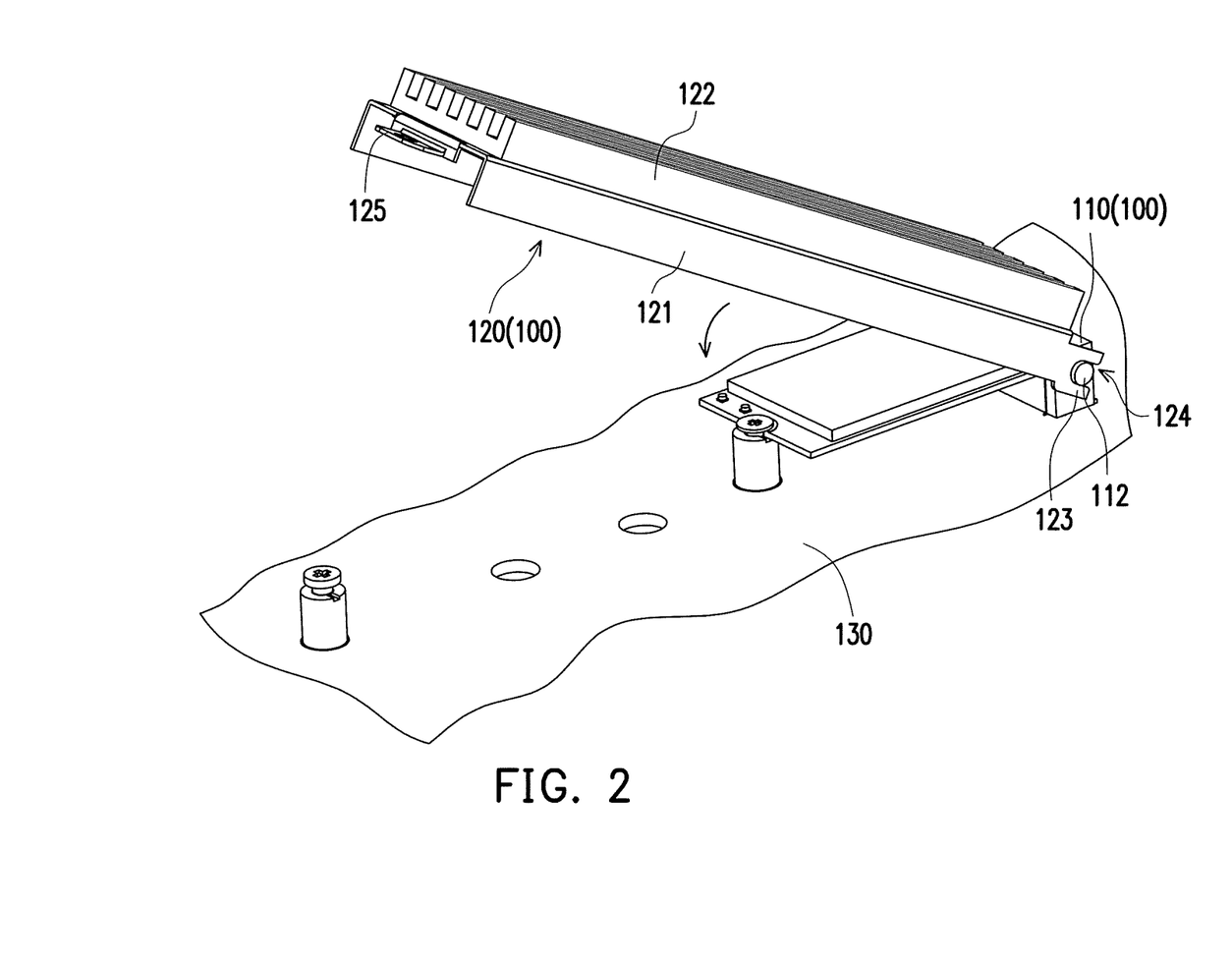
Figure 3:
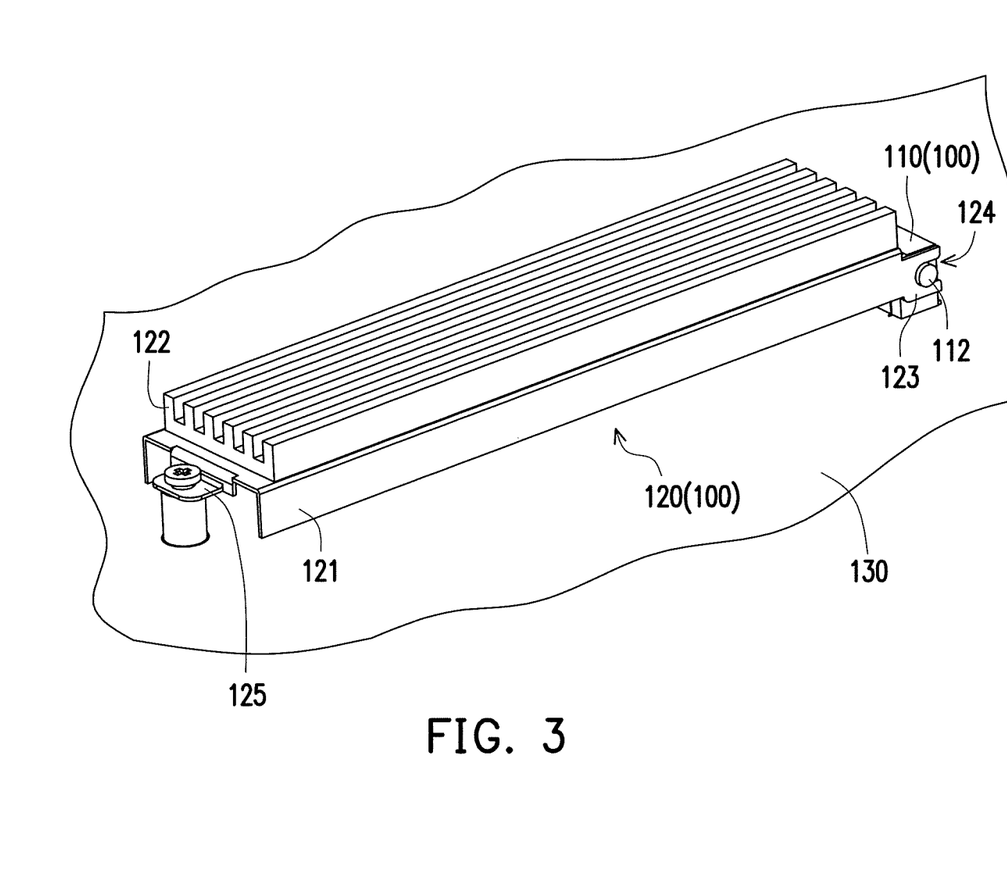
Figure 4:
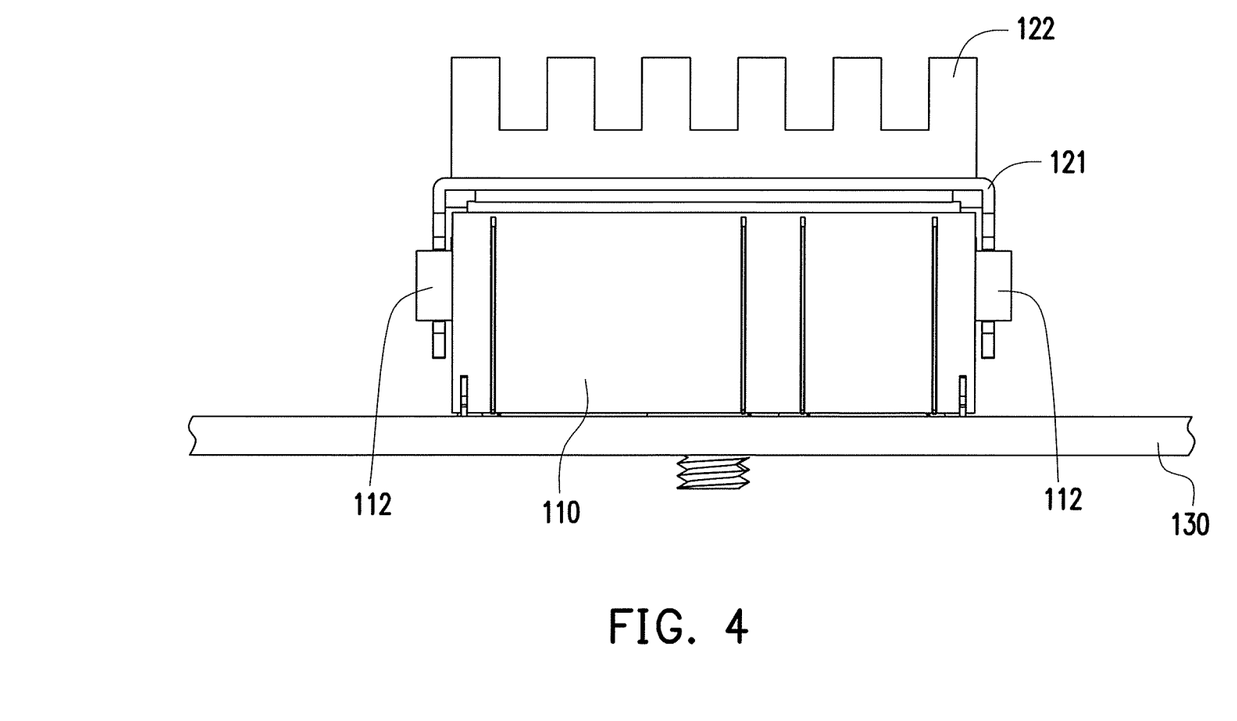
FIG. 4 is a schematic side view illustrating the connector module of FIG. 1.

FIGS. 1 to 3 are schematic views illustrating assembling of a connector module according to an embodiment of the invention. FIG. 4 is a schematic side view illustrating the connector module of FIG. 1. FIG. 1 is a schematic view illustrating that a heatsink 120 is assembled to a connector 110 along a single axial direction. FIG. 2 is a schematic view illustrating that the heatsink 120 pivotally rotates on a shaft 112. FIG. 3 is a schematic view illustrating that the heatsink 120 is fixed to a circuit board 130 through a fixing part 125. Referring to FIGS. 1 to 4, a connector module 110 of the embodiment includes a connector 110 and a heatsink 120. In addition, the heatsink 120 may be installed to the circuit board 130.

The heatsink 120 of the embodiment includes a base 121, a fin set 122 disposed on the base 121, and a pivot part 123 extending from the base 121. The heatsink 120 includes a groove 124 recessed along a single direction. The connector 110 includes a shaft 112. The heatsink 120 may move along a single axial direction opposite to the recessed direction of the groove 124 to insert the shaft 112 into the groove 124 (shown in FIG. 1). The shaft 112 is pivoted in the groove 124, so that the heatsink 120 may pivotally rotate relative to the connector 110. Accordingly, with the groove 124 of the heatsink 120, the shaft 112 may be easily moved into or out of the groove 124 to simply and quickly assemble the heatsink 120 to the connector 110. In addition, the structural design of the groove 124 is able to reduce the chance that the shaft 112 is damaged when the heatsink 120 is removed from the shaft 112.

In the embodiment, the groove 124 is located on the pivot part 123. The groove 124 may be a U-shaped or a C-shaped groove. The recessed direction of the groove 124 on the pivot part 123 is parallel to an extending direction of the base 121, and a width at an opening of the groove 124 is greater than a width at an inside of the groove 124.

The base 121 of the embodiment may include a fixing part 125 to fix the heatsink 120 on the circuit board 130. As shown in FIG. 4, when the heatsink 120 is to be installed to the circuit board 130, the heatsink 120 may be pivoted to the shaft 112 through the pivot part 123, and the heatsink 120 may be further fixed to the circuit board 130 through the fixing part 125 on the base 121. Through the structural design, when the groove 124 is coupled to the shaft 112, the pivot part 123 may be easily aligned to the shaft 112 to easily and quickly assemble the heatsink 120 to the connector 110. In addition, the heatsink 120 may be easily and quickly assembled to the circuit board 130 having the connector 110.

Figure 5:
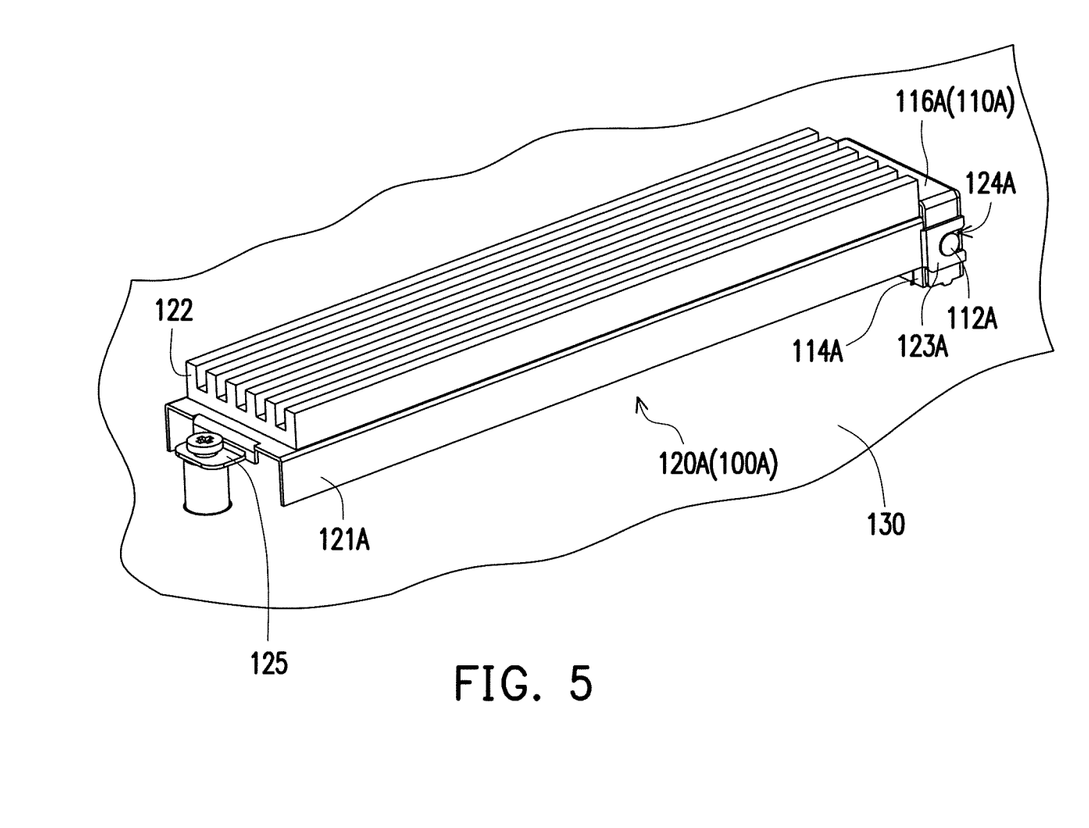
FIG. 5 is a schematic view illustrating a connector module according to another embodiment of the invention.
Figure 6:
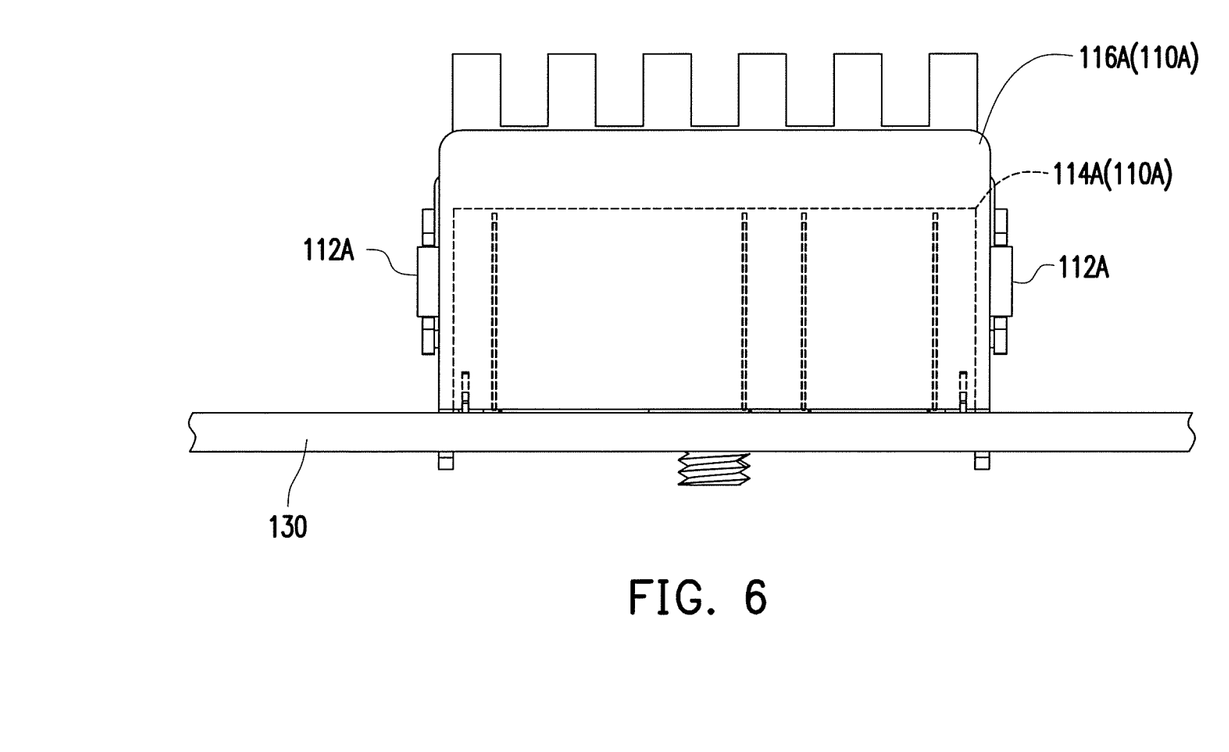
FIG. 6 is a schematic side view illustrating the connector module of FIG. 5.

FIG. 5 is a schematic view illustrating a connector module according to another embodiment of the invention. FIG. 6 is a schematic side view illustrating the connector module of FIG. 5. FIG. 6 is a schematic view illustrating that a cover 116A covers a connector body 114A. For the ease of description, FIG. 6 illustrates the connector body 114A blocked by the cover 116A with broken lines. Since the cover 116A has a greater height, some components of the heatsink in FIG. 6 are blocked by the cover 116A. In the connector module 100A of the embodiment, components same as or similar to the connector module 100 are referred to by the same or similar reference symbols, and the following only describes the difference between the connector module 100 and the connector module 100A. Referring to FIGS. 5 and 6, the heatsink 120A includes a base 121A and a pivot part 123A extending from the base 121A. In addition, the pivot part 123A located on the heatsink 120A includes a groove 124A recessed in a single direction.

The connector 110A includes the connector body 114A and the cover 116A. The cover 116A covers the connector body 114A, and a shaft 112A is located on the cover 116A. Since the connector body 114A is covered by the cover 116A, the pivot part 123A located on the heatsink 120A is arranged as a structure coping with a shape of the cover 116A. Accordingly, the shaft 112A on the cover 116A may enter the groove 124A located at the pivot part 123A along a single axial direction, so that the heatsink 120A may pivotally rotate relative to the connector 110A. In addition, the cover 116A covering the connector body 114A may prevent electromagnetic interference (EMI).

Figure 7:
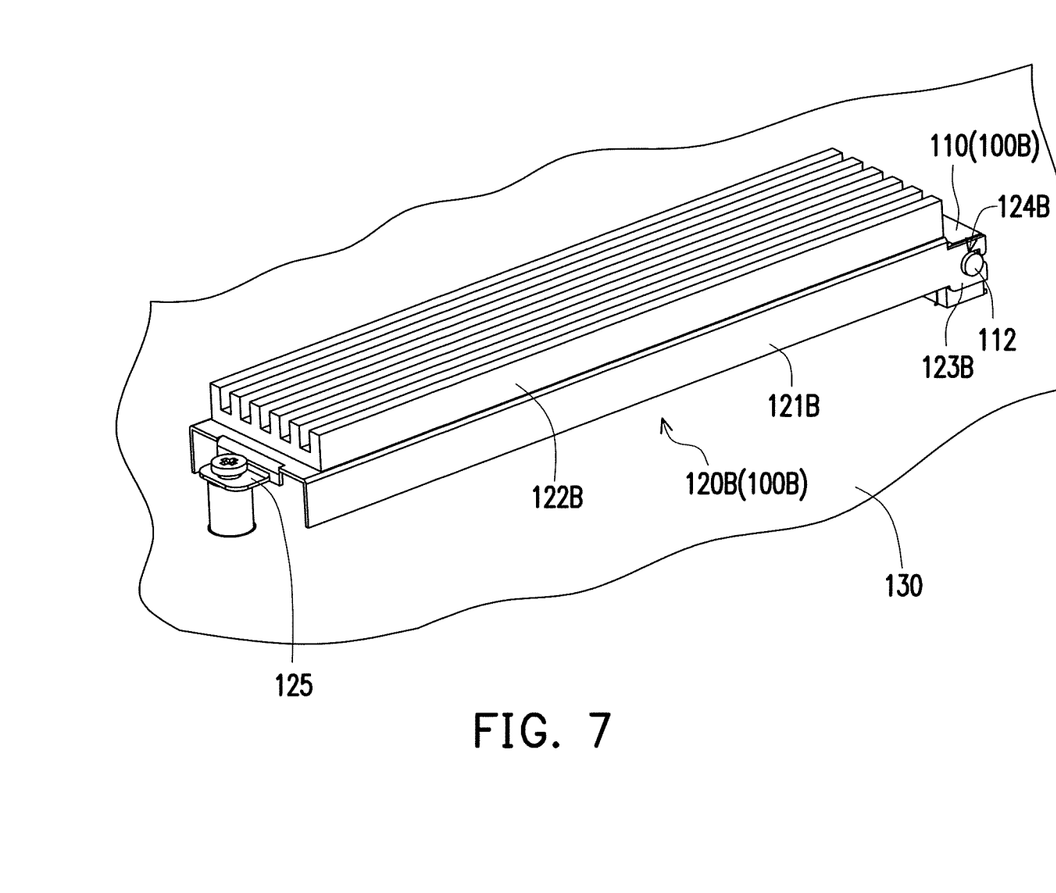
FIG. 7 is a schematic view illustrating a connector module according to still another embodiment of the invention.
Figure 8:
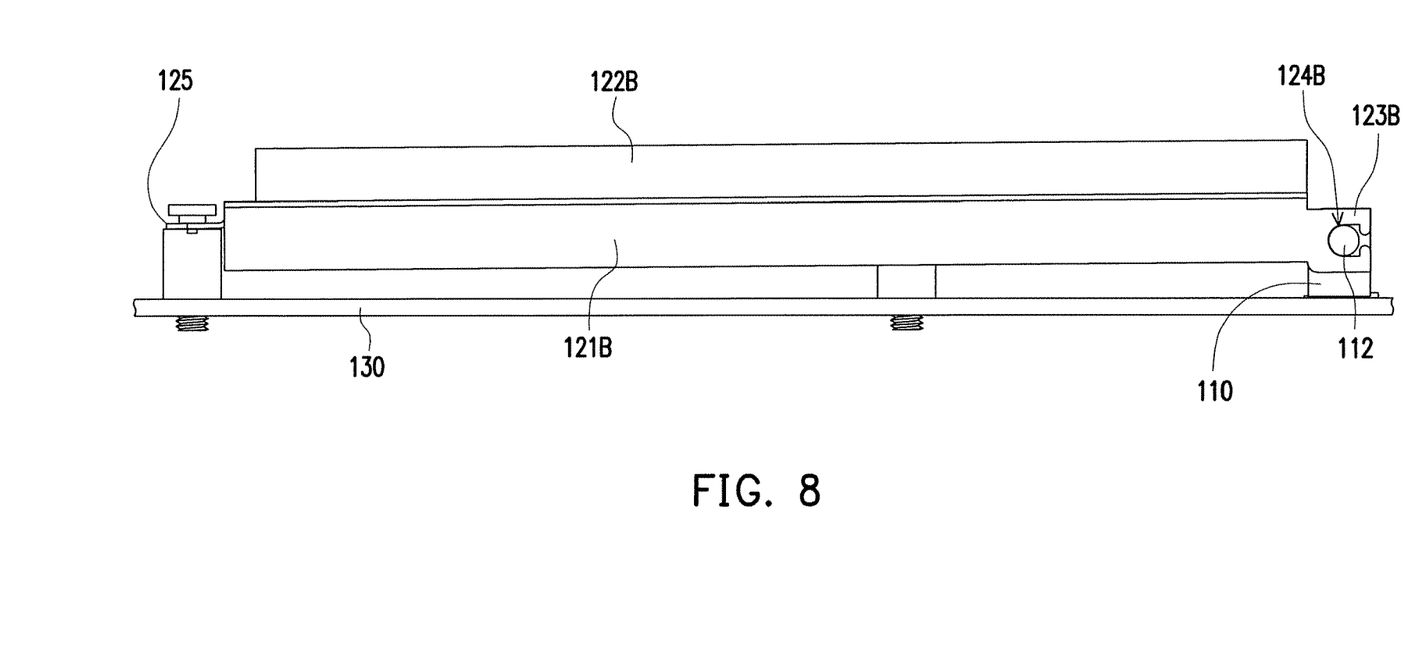
FIG. 8 is a schematic side view illustrating the connector module of FIG. 7.

FIG. 7 is a schematic view illustrating a connector module according to still another embodiment of the invention. FIG. 8 is a schematic side view illustrating the connector module of FIG. 7. In the connector module 100B of the embodiment, components same as or similar to the connector module 100 are referred to by the same or similar reference symbols, and the following only describes the difference between the connector module 100 and the connector module 100B. Referring to FIGS. 7 and 8, a heatsink 120B of the embodiment includes a base 121B, a fin set 122B disposed on the base 121B, and a pivot part 123B extending from the base 121B. The groove 124B is located on the pivot part 123B, and the recessed direction of the groove 124B on the pivot part 123B is perpendicular to an extending direction of the base 121B. In the embodiment, a width at an opening of the groove 124B is less than a width at an inside of the groove 124B. The structural design effectively enables the pivot part 123B to be firmly pivoted to the shaft 112.

Figure 9:
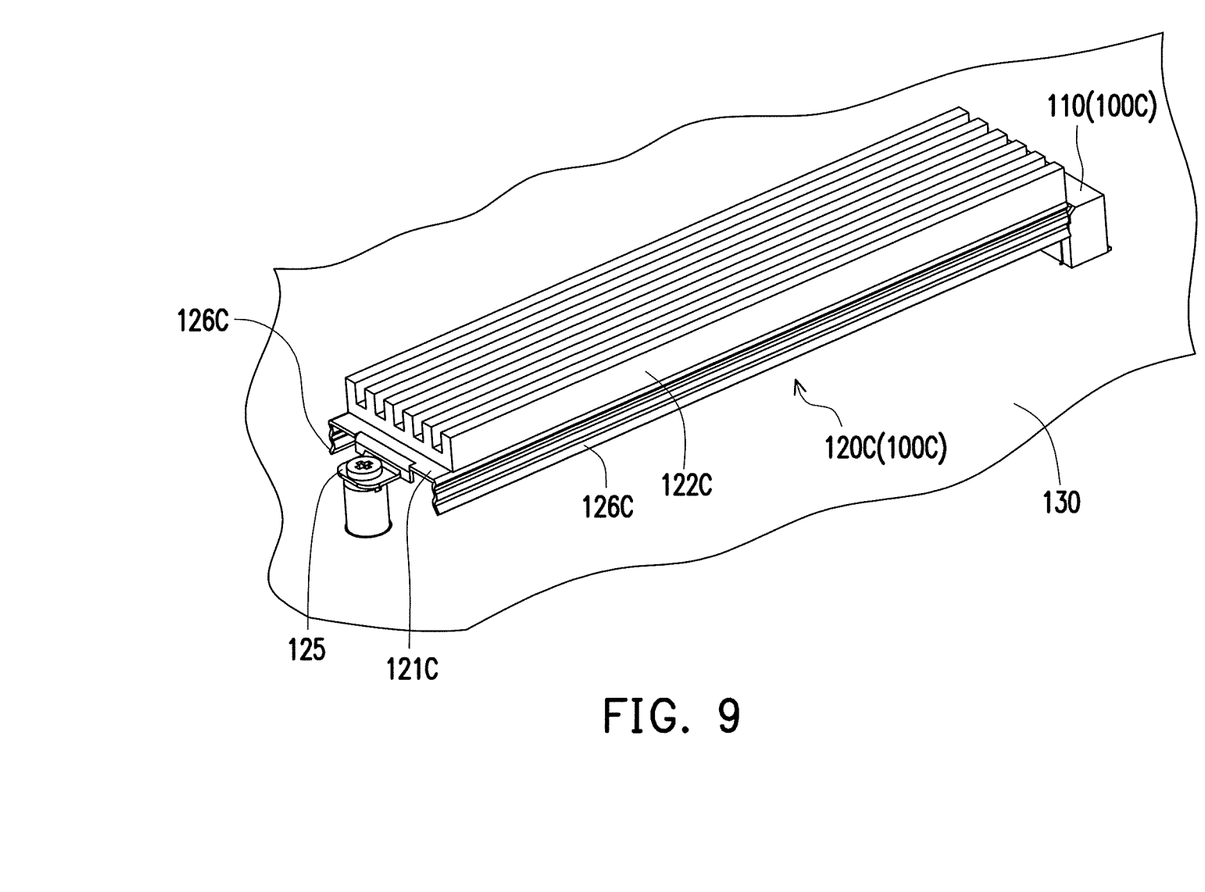
FIG. 9 is a schematic view illustrating a connector module according to yet another embodiment of the invention.
Figure 10:
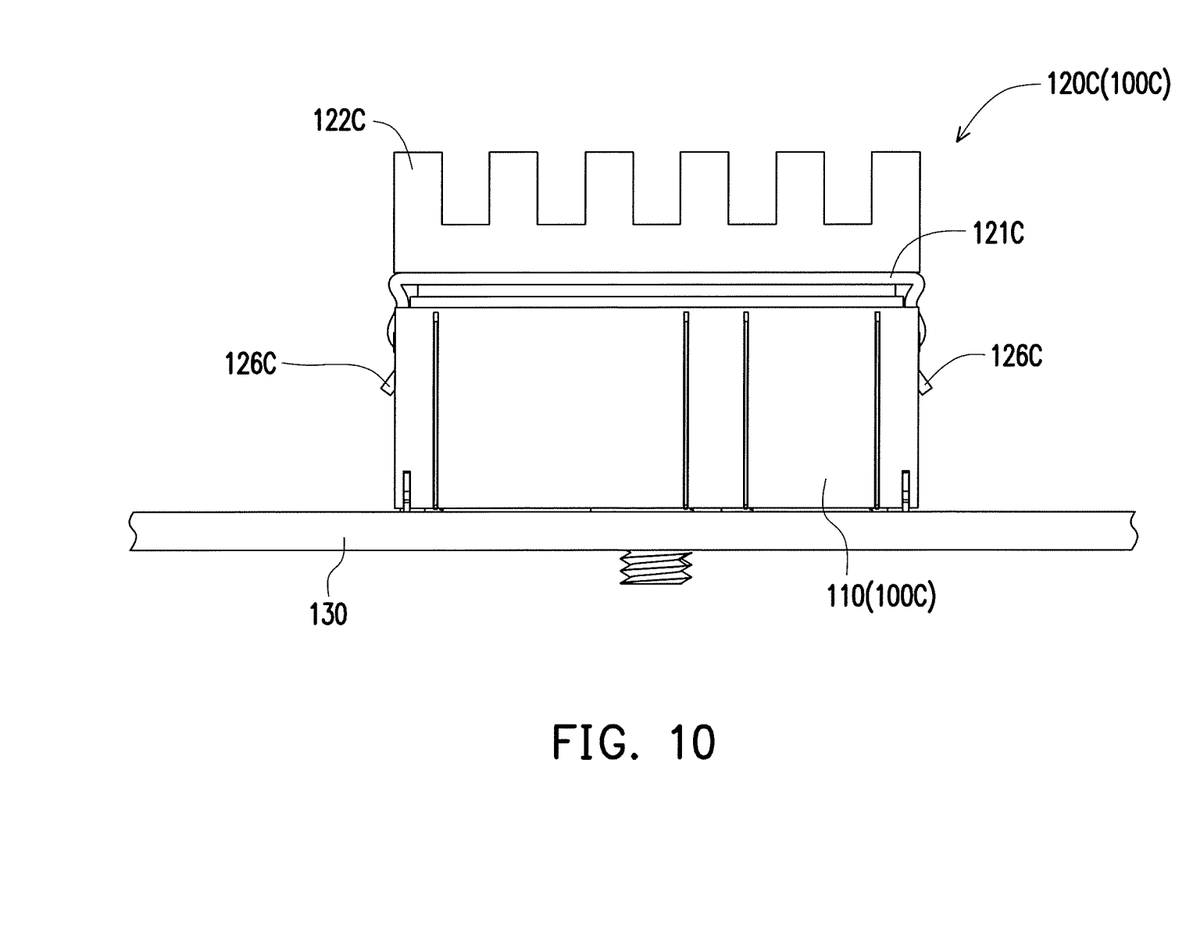
FIG. 10 is a schematic side view illustrating the connector module of FIG. 9.

FIG. 9 is a schematic view illustrating a connector module according to yet another embodiment of the invention. FIG. 10 is a schematic side view illustrating the connector module of FIG. 9. In a connector module 100C of the embodiment, components same as or similar to the connector module 100 are referred to by the same or similar reference symbols, and the following only describes the difference between the connector module 100 and the connector module 100C. Referring to FIGS. 9 and 10, a heatsink 120C of the embodiment includes a base 121C, a fin set 122C disposed on the base 121C, and two holding parts 126C located at opposite sides of the heatsink 120. The holding parts 126C extend from the base 121C in a direction away from the fin set 122C. The holding part 126C may be an elastic holding structure. With the structural design, the heatsink 120C may be installed more quickly and easily. In addition, the risk of a structural damage caused by an inadequate operation is reduced. It should be noted that the holding part of the embodiment may also be used with other embodiments. For example, a heatsink may include the holding parts and the pivot part, so that when the heatsink is installed to the connector, the heatsink may be further fixed through the holding parts. Also, the heatsink may be fixed on the circuit board by the holding parts, the pivot part and the fixing part. The invention does not intend to impose a limitation on this regard.

Figure 11:
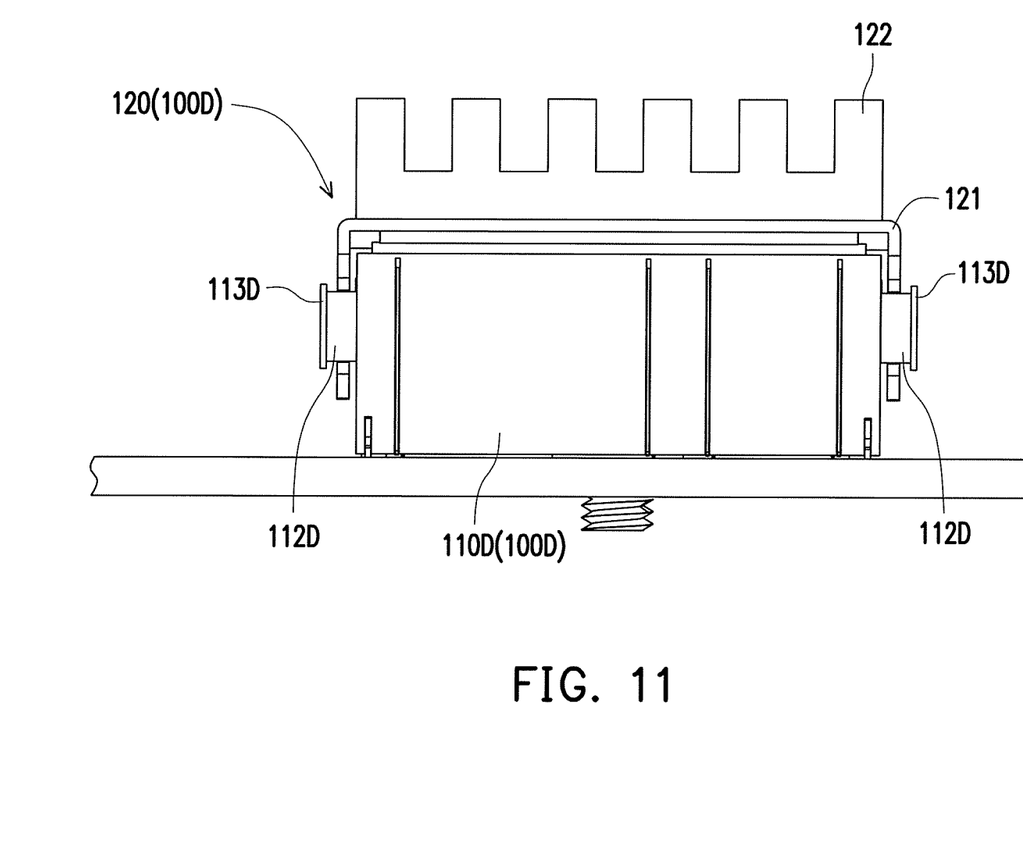
FIG. 11 is a schematic side view illustrating a connector module according to one further embodiment of the invention.

FIG. 11 is a schematic side view illustrating a connector module according to one further embodiment of the invention. In a connector module 100D of the embodiment, components same as or similar to the connector module 100 are referred to by the same or similar reference symbols, and the following only describes the difference between the connector module 100 and the connector module 100D. Referring to FIG. 11, a connector 110D of the embodiment includes a shaft 112D. The shaft 112D includes a blocking part 113D located at an end. In addition, a width of the blocking part 113D is greater than the width of the groove 124. Therefore, when the heatsink 120 is installed on the circuit board 130, axial sliding of the heatsink 120 on the shaft 112D may be limited, so that the heatsink 120 is more firmly fixed on the circuit board 130.

In view of the foregoing, in the connector module according to the embodiments of the invention, the groove of the heatsink may be easily aligned to the shaft of the connector. Therefore, the heatsink is able to be quickly installed to the connector. In addition, the chance that the shaft is damaged when the heatsink is removed from the shaft during installation/uninstallation may be reduced. Besides, if the shaft of the connector is located on the cover, the cover may effectively reduce electromagnetic interference (EMI) in addition to providing the shaft to dispose the heatsink.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A connector module adapted for an expansion card, comprising:
   a connector, comprising a shaft; and
   a heatsink, comprising a groove recessed in a single direction, wherein the heatsink is adapted to move in a direction opposite to the recessed direction of the groove to insert the shaft into the groove, and the shaft is pivoted in the groove, so that the heatsink is adapted to pivotally rotate relative to the connector
   wherein the heatsink comprises a base, a fin set, and two holding parts, wherein the fin set is disposed on the base, and wherein the two holding parts extend from two opposite sides of the base in a direction away from the fin set and towards a direction below the base so as to clamp the expansion card inserted to the connector.

2. The connector module as claimed in claim 1, wherein the connector comprises a connector body and a cover, the cover covers the connector body, and the shaft is located on the cover.

3. The connector module as claimed in claim 1, wherein the groove is a U-shaped groove.

4. The connector module as claimed in claim 3, wherein a width at an opening of the groove is greater than a width at an inside of the groove.

5. The connector module as claimed in claim 1, wherein the heatsink comprises a pivot part extending from the base, the groove is located on the pivot part, and the recessed direction of the groove on the pivot part is parallel to an extending direction of the base.

6. The connector module as claimed in claim 1, wherein the heatsink comprises a pivot part extending from the base, the groove is located on the pivot part, and the recessed direction of the groove on the pivot part is perpendicular to an extending direction of the base.

7. The connector module as claimed in claim 1, wherein the heatsink comprises the base comprises a fixing part configured to fix a circuit board.

8. The connector module as claimed in claim 1, wherein the shaft comprises a blocking part located at an end, and a width of the blocking part is greater than a width of the groove.

* * * * *